(12) United States Patent
Choi et al.

(10) Patent No.: US 11,257,991 B2
(45) Date of Patent: Feb. 22, 2022

(54) LIGHT EMITTING DEVICE, BACKLIGHT UNIT AND DISPLAY APPARATUS

(71) Applicant: SAMSUNG ELECTRONICS CO., LTD., Suwon-si (KR)

(72) Inventors: Sungwoo Choi, Suwon-si (KR); Seongmin Kim, Seongnam-si (KR); Inhyung Lee, Hanam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 16/732,586

(22) Filed: Jan. 2, 2020

(65) Prior Publication Data
US 2020/0381596 A1 Dec. 3, 2020

(30) Foreign Application Priority Data
Jun. 3, 2019 (KR) .................... 10-2019-0065552

(51) Int. Cl.
*H01L 33/50* (2010.01)
*H01L 25/075* (2006.01)
*H01L 33/06* (2010.01)
*H01L 33/56* (2010.01)

(52) U.S. Cl.
CPC ........ *H01L 33/504* (2013.01); *H01L 25/0753* (2013.01); *H01L 33/06* (2013.01); *H01L 33/56* (2013.01)

(58) Field of Classification Search
CPC combination set(s) only.
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |

(Continued)

FOREIGN PATENT DOCUMENTS

| | | |
|---|---|---|
| CN | 109560074 A | 4/2019 |
| JP | 2014-107501 A | 6/2014 |

(Continued)

OTHER PUBLICATIONS

Extended European Search Report dated Sep. 22, 2020 in corresponding EP 20167505.5.

*Primary Examiner* — Yu-Hsi D Sun
(74) *Attorney, Agent, or Firm* — Lee IP Law, P.C.

(57) ABSTRACT

A light emitting device includes a first LED chip to emit a light having a peak wavelength in a range of 410 to 430 nm, a second LED chip to emit a light having a peak wavelength in a range of 440 to 460 nm, a first quantum dot to convert light emitted by the first and second LED chips into light having a peak wavelength in a range of 510 to 550 nm, and a second quantum dot to convert light emitted by the first and second LED chips into light having a peak wavelength in a range of 610 to 660 nm, wherein, in an emission spectrum of final light, intensity of a peak wavelength of the first LED chip is 15% or less of intensity of a peak wavelength of the second LED chip.

20 Claims, 10 Drawing Sheets

(56) References Cited

U.S. PATENT DOCUMENTS

| | | |
|---|---|---|
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,072,148 B2 | 6/2015 | Tanaka et al. |
| 9,736,900 B1* | 8/2017 | Stuppi ............ F21V 9/32 |
| 9,772,071 B2 | 9/2017 | Van Bommel et al. |
| 9,877,370 B2 | 1/2018 | Peeters et al. |
| 10,062,673 B2 | 8/2018 | Schmidt et al. |
| 2012/0113672 A1 | 5/2012 | Dubrow et al. |
| 2015/0300577 A1* | 10/2015 | Van Bommel ............ F21K 9/64 |
| | | 362/84 |
| 2016/0284949 A1 | 9/2016 | Hagelaar et al. |
| 2017/0097458 A1 | 4/2017 | Kimura et al. |
| 2017/0111972 A1* | 4/2017 | Oepts ............ F21V 13/08 |
| 2017/0194535 A1* | 7/2017 | Park ............ H01L 33/504 |
| 2018/0269360 A1 | 9/2018 | Yeon et al. |
| 2018/0323349 A1* | 11/2018 | Kim ............ C09K 11/0883 |
| 2018/0323352 A1* | 11/2018 | Takano ............ H01L 33/502 |
| 2018/0364553 A1* | 12/2018 | Chou ............ C09K 11/883 |
| 2019/0013446 A1 | 1/2019 | Byun et al. |
| 2019/0148605 A1* | 5/2019 | Mu ............ H01L 33/50 |
| | | 257/98 |

FOREIGN PATENT DOCUMENTS

| | | |
|---|---|---|
| JP | 2018-082034 A | 5/2018 |
| JP | 2018-156966 A | 10/2018 |
| KR | 10-2017-0077679 A | 7/2017 |
| KR | 10-2017-0101711 A | 9/2017 |
| WO | WO 2018/140727 A1 | 8/2018 |

* cited by examiner

LIGHT EMITTING DEVICE, BACKLIGHT UNIT AND DISPLAY APPARATUS

CROSS-REFERENCE TO RELATED APPLICATION

Korean Patent Application No. 10-2019-0065552, filed on Jun. 3, 2019, in the Korean Intellectual Property Office, and entitled: "Light Emitting Device, Backlight Unit and Display Apparatus," is incorporated by reference herein in its entirety.

BACKGROUND

1. Field

The present disclosure relates to a light emitting device, a backlight unit, and a display device.

2. Description of the Related Art

Generally, a white light emitting device may be manufactured in a form in which various wavelength conversion materials are combined with a blue light emitting diode (LED) chip. The white light emitting device may be used as a high efficiency light source for a display device. For example, quantum dots may be used as the wavelength conversion materials for reproduction of colors in the display device.

SUMMARY

According to an exemplary embodiment, a light emitting device includes a first LED chip emitting light having a peak wavelength in a range of 410 nm to 430 nm, a second LED chip emitting light having a peak wavelength in a range of 440 nm to 460 nm, a first quantum dot disposed on a path of light emitted by the first and second LED chips and converting a portion of the emitted light into light having a peak wavelength in a range of 510 nm to 550 nm, and a second quantum dot disposed on a path of light emitted by the first and second LED chips and converting a portion of the emitted light into light having a peak wavelength in a range of 610 nm to 660 nm, wherein, in an emission spectrum of final light, intensity of a peak wavelength of the first LED chip is equal to 15% or less of intensity of a peak wavelength of the second LED chip.

According to an exemplary embodiment, a light emitting device includes a first LED chip emitting light having a peak wavelength in a range of 410 nm to 430 nm, a second LED chip emitting light having a peak wavelength in a range of 440 nm to 460 nm, and a wavelength conversion film having first and second quantum dots disposed on a path of light emitted by the first and second LED chips and converting a portion of the emitted light into light of first and second peak wavelengths, respectively, wherein the first peak wavelength is in a range of 510 nm to 550 nm, the second peak wavelength is in a range of 610 nm to 660 nm, and, in an emission spectrum of final light, intensity of a peak wavelength of the first LED chip is equal to 15% or less of intensity of a peak wavelength of the second LED chip.

According to an exemplary embodiment, a backlight unit includes an LED module having a first LED chip emitting light having a peak wavelength in a range of 410 nm to 430 nm and a second LED chip emitting light having a peak wavelength in a range of 440 nm to 460 nm, and a wavelength conversion film having first and second quantum dots disposed on a path of light emitted by the LED module and converting a portion of the emitted light into light of first and second peak wavelengths, respectively, wherein the first peak wavelength is in a range of 510 nm to 550 nm, the second peak wavelength is in a range of 610 nm to 660 nm, and, in an emission spectrum of final light, intensity of a peak wavelength of the first LED chip is equal to 15% or less of intensity of a peak wavelength of the second LED chip.

According to an exemplary embodiment, a display device includes an image display panel having a color filter layer comprising color filters of red, green, and blue, and a backlight unit disposed on a lower surface of the image display panel, wherein the backlight unit comprises: an LED module having a first LED chip emitting light having a peak wavelength in a range of 410 nm to 430 nm and a second LED chip emitting light having a peak wavelength in a range of 440 nm to 460 nm; and a wavelength conversion film having first and second quantum dots disposed on a path of light emitted by the LED module and converting a portion of the emitted light into light of first and second peak wavelengths, wherein the first peak wavelength is in a range of 510 nm to 550 nm, the second peak wavelength is in a range of 610 nm to 660 nm, and, in an emission spectrum of final light, intensity of a peak wavelength of the first LED chip is equal to 15% or less of intensity of a peak wavelength of the second LED chip.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, various exemplary embodiments will be described in detail with reference to the accompanying drawings.

Figure 1:
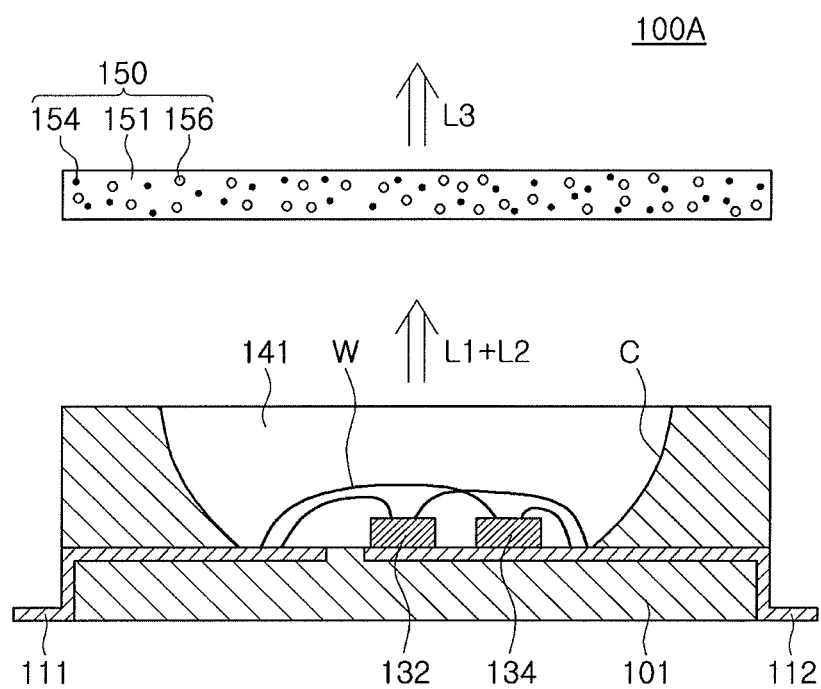
FIG. 1 illustrates a schematic cross-sectional view of a light emitting device according to an exemplary embodiment.

FIG. 1 is a schematic cross-sectional view of a light emitting device according to an exemplary embodiment.

Referring to FIG. 1, a light emitting device 100A may include a package body 101, a first LED chip 132 and a second LED chip 134 respectively arranged on the package body 101, and a wavelength conversion film 150. For example, as illustrated in FIG. 1, the wavelength conversion film 150 may be above the package body 101 and the first and second LED chips 132 and 134.

In detail, the package body 101 may be coupled to a pair of lead frames 111 and 112, and may include a concave portion C providing a sidewall reflective structure. For example, as illustrated in FIG. 1, a portion of the package body 101 may be removed to define a cavity within the package body 101 with a flat bottom and curved sidewalls that extend from the flat bottom, e.g., the cavity may be concave with respect to the package body 101 to define the concave portion C. The first and second LED chips 132 and 134 may be arranged on a bottom surface of the concave portion C, and may be electrically connected to the lead frames 111 and 112 using wires W, respectively. For example, as illustrated in FIG. 1, portions of the pair of lead frames 111 and 112 may extend through the package body 101 to be exposed to the concave portion C, such that the first and second LED chips 132 and 134 may be positioned, e.g., directly, on the lead frame 112, while the wires W may extend from each of the first and second LED chips 132 and 134 to the pair of lead frames 111 and 112. The light emitting device 100A may further include a resin packaging portion 141 disposed in the concave portion C to surround the first and second LED chips 132 and 134, e.g., the resin packaging portion 141 may completely fill the concave portion C to cover the first and second LED chips 132 and 134 with the wires W.

The package body 101 may be made of a polymer resin which is easy to be injected. For example, the resin may be an opaque resin, or a resin containing a highly reflective powder particle (e.g. $Al_2O_3$). In another example, the package body 101 may include a ceramic substrate. In this case, heat dissipation through the package body 101 may be facilitated. In a specific embodiment, the package body 101 may be a printed circuit board on which wiring patterns are formed.

Figure 9:
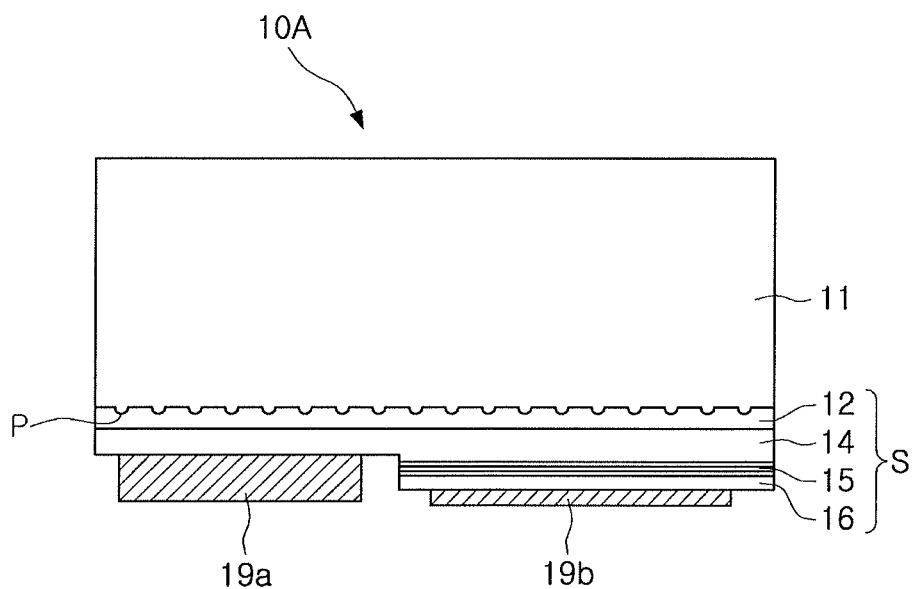
FIGS. 9 and 10 illustrate cross-sectional views of LED chips in a light emitting device according to an exemplary embodiment.
Figure 10:
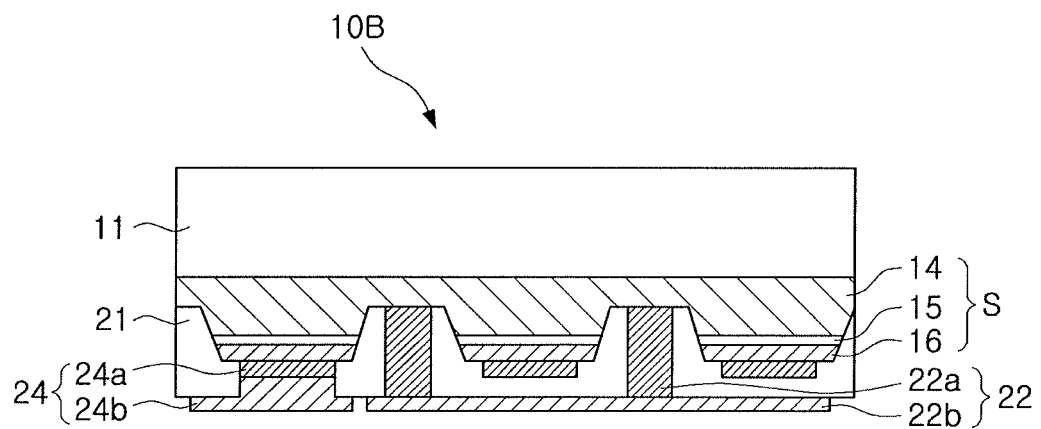

The first and second LED chips 132 and 134 may include an epitaxially grown semiconductor layer, respectively (see FIGS. 9 and 10). The first LED chip 132 may emit light having a peak wavelength in a range of 410 nm to 430 nm. For example, the first LED chip 132 may emit near-UV and violet light. The second LED chip 134 may be a blue LED chip emitting light having a peak wavelength in a range of 440 nm to 460 nm. In some embodiments, the peak wavelength of the second LED chip 134 may range from 445 nm to 460 nm.

The wavelength conversion film 150 may include a transparent body 151 containing a first quantum dot 154 and a second quantum dot 156. The wavelength conversion film 150 may be disposed on a path of light (L1+L2) emitted by the first and second LED chips 132 and 134. According to an embodiment, the wavelength conversion film 150 may be disposed to be spaced apart from the first and second LED chips 132 and 134, which generate heat, to prevent deterioration of the first and second quantum dots 154 and 156 in the wavelength conversion film 150, e.g., due to the generated heat.

The transparent body 151 of the wavelength conversion film 150 may include a transparent resin body or a low-temperature sintered glass. For example, the transparent resin body may include epoxy, silicone, or a combination thereof.

The first quantum dot 154 may convert at least a portion of light, among the emitted light L1+L2, into green light, e.g., light having a peak wavelength in a range of 510 nm to 550 nm. The second quantum dot 156 may convert at least a portion of light, among the emitted light L1+L2, into red light, e.g., light having a peak wavelength in a range of 610 nm to 660 nm. The light converted from the first and second quantum dots 154 and 156, i.e., final white light L3, may have a full width at half maximum of 40 nm or less.

For example, the first and second quantum dots 154 and 156 may include at least one of InP/ZnS, InP/ZnSe, CdSe/CdS, CdSe/ZnS, PbS/ZnS, InP/ZnSe/ZnS, and InP/GaP/ZnS. In some embodiments, the first and second quantum dots 154 and 156 may include at least one of InP/ZnS, InP/ZnSe, and InP/ZnSe/ZnS. The first and second quantum dots 154 and 156 may be sized to satisfy a desired wavelength condition.

The wavelength converted from the quantum dot employed in this embodiment may be changed by adjusting a diameter (D) of the quantum dot. For example, a diameter of a core, e.g., of each quantum dot, may be about 1 nm to about 30 nm, e.g., about 3 nm to about 10 nm. A thickness of a shell, e.g., surrounding a corresponding core of each quantum dot, may be about 0.1 nm to about 20 nm, e.g., about 0.5 nm to about 2 nm. By adjusting the diameter of the quantum dots, e.g., by adjusting the size of the core and/or the shell of the quantum dots, the conversion wavelength may be changed in a range of 510 nm (green) to 660 nm (red). As described above, various colors may be realized depending on the diameter of the quantum dots, and a relatively narrow full width at half maximum (for example, about 35 nm) may be realized.

As such, the quantum dot may realize various colors depending on its size, and may be used as a red or green phosphor, when used as a substitute for a phosphor. When quantum dots are used, a relatively narrow full width at half maximum (e.g., about 35 nm) may be realized.

Figure 4:
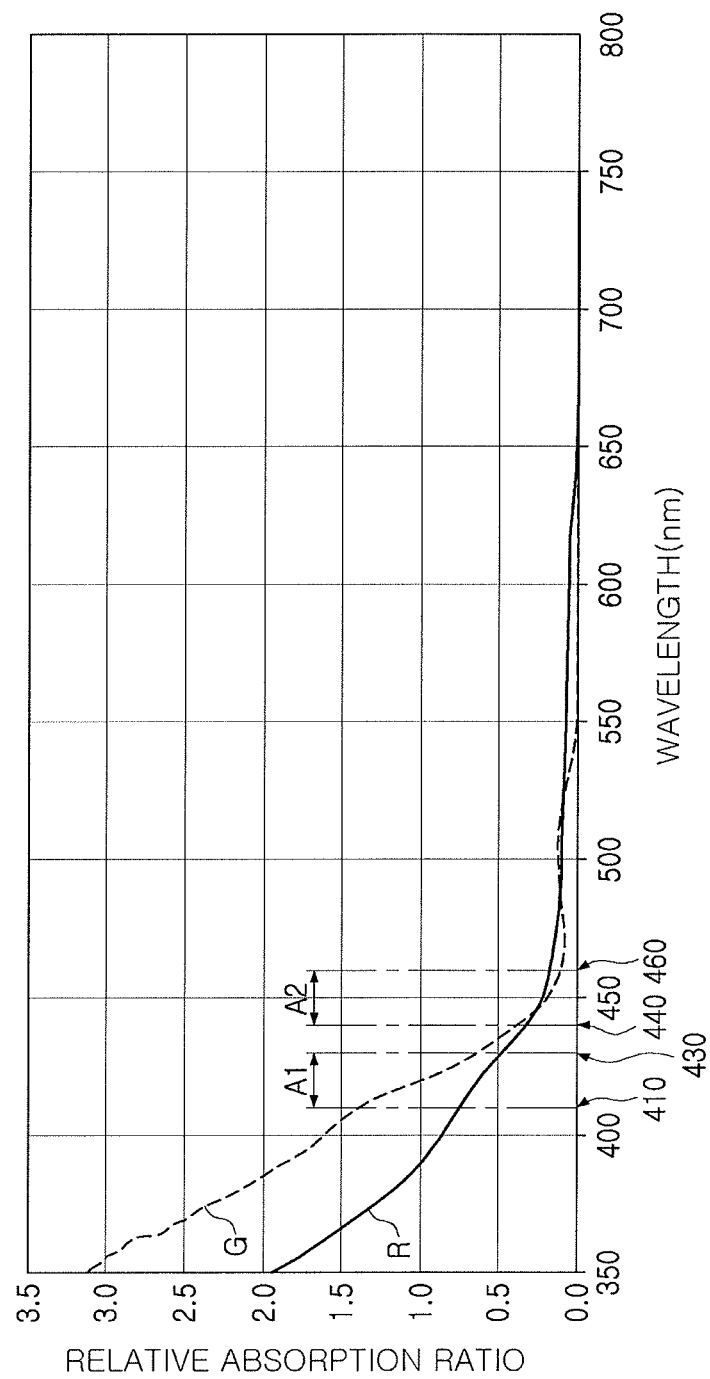
FIG. 4 illustrates a graph of relative absorption ratios of green and red quantum dots, depending on wavelengths.

In this embodiment, in addition to the second LED chip 134 (which emits blue light in the range of 440 nm to 460 nm), the first LED chip 132 may be added as an excitation light source (which emits violet light in a range below 430 nm), to increase an excitation state of the first and second quantum dots 154 and 156, and thereby, to greatly improve the light conversion efficiency of the first and second quantum dots 154 and 156. Specifically, an effect of improving the light conversion efficiency according to this embodiment may be described with reference to FIG. 4. FIG. 4 illustrates absorption ratios of the first and second quantum dots 154 and 156, depending on wavelengths.

Referring to FIG. 4, it can be confirmed that the light absorption ratio in a peak wavelength range A1 of the first LED chip 132 (e.g., about 410 nm to about 430 nm) is higher than the absorption ratio in the range of a peak wavelength A2 of the second LED chip 134 (e.g., about 440 nm to about 460 nm). For example, an absorption ratio at a wavelength of 430 nm may be greater than an absorption ratio at a wavelength of 450 nm by about 2 times to about 3 times. As described above, light conversion efficiency of light (L1) of the first LED chip 132 may be greatly improved, as compared with light conversion efficiency of light (L2) of the second LED chip 134.

Therefore, adding the first LED chip 132 as excitation light of the first and second quantum dots 154 and 156, increases the light conversion efficiency of the first and second quantum dots 154 and 156 with respect to the second LED chip 134, which emits blue light I the range of about 440 nm to about 460 nm. Further, as the light conversion efficiency of the first and second quantum dots 154 and 156 is increased, the content of the first and second quantum dots 154 and 156 in the wavelength conversion film 150 may be lowered. That is, extraction efficiency of the light emitted by the wavelength conversion film 150 may be greatly improved by adding the first LED chip 132 therein as excitation light to lower the content of the first and second quantum dots 154 and 156.

For example, when the wavelength conversion film 150 includes the transparent body 151, a combined weight of the first and second quantum dots 154 and 156 may be about 5 wt % to about 30 wt %, e.g., about 15 wt % or less, based on the weight of the transparent resin body of the transparent body 151. For example, a total weight of the first quantum dots 154 may be larger than that of the second quantum dots 156. For example, the first and second quantum dots 154 and 156 may be at least one of InP/ZnS, InP/ZnSe, and InP/ZnSe/ZnS, e.g., the first and second quantum dots 154 and 156 may include different materials. For example, when the first and second quantum dots 154 and 156 are at least one of InP/ZnS, InP/ZnSe, and InP/ZnSe/ZnS, respectively, the first quantum dot 154 may be in a range of about 5 wt % to about 10 wt % based on the weight of the transparent resin body, and the second quantum dot 156 may be in the range of about 1 wt % to about 5 wt % based on the weight of the transparent resin body.

Light having a relatively short wavelength, e.g., light (L1) of the first LED chip 132, may not contribute to the white light (or the color reproduction ratio of the display device), and may be harmful to the human body. Therefore, the intensity (S1') of the short wavelength peak may be adjusted in the spectrum of the final white light (L3) transmitted through the wavelength conversion film 150 to address such effects.

Figure 3:
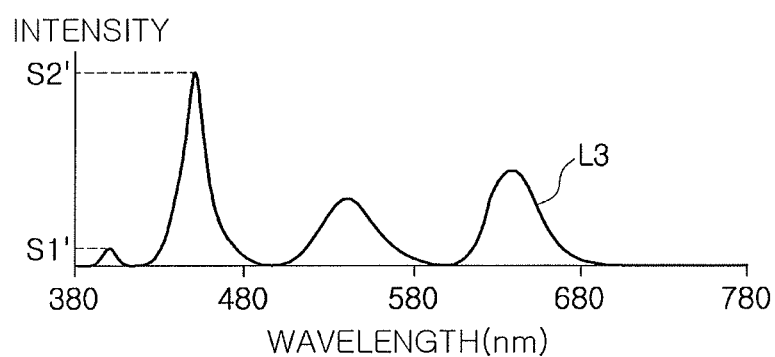
FIG. 3 illustrates an emission spectrum of final light in a light emitting device according to an exemplary embodiment.

In detail, as illustrated in FIG. 3, in the spectrum of the final white light (L3) emitted from the wavelength conversion film 150, the intensity (S') of peak due to the light (L1) of the first LED chip 132 may be designed to fall within a range of 15%, e.g., about 3% to 10%, of the intensity (S2') of peak due to the light (L2) of the second LED chip 134. In other words, while the first LED chip 132 may be implemented as an excitation light source for the quantum dots in the wavelength conversion film 150 at a relatively short wavelength, the intensity (S') of such emitted violet light (L1) is specifically designed to be low, e.g., about 15% or lower than the intensity (S2') of the blue light (L2) emitted from the second LED chip 134, in order to minimize any harmful effects of the short wavelength light.

Figure 2:
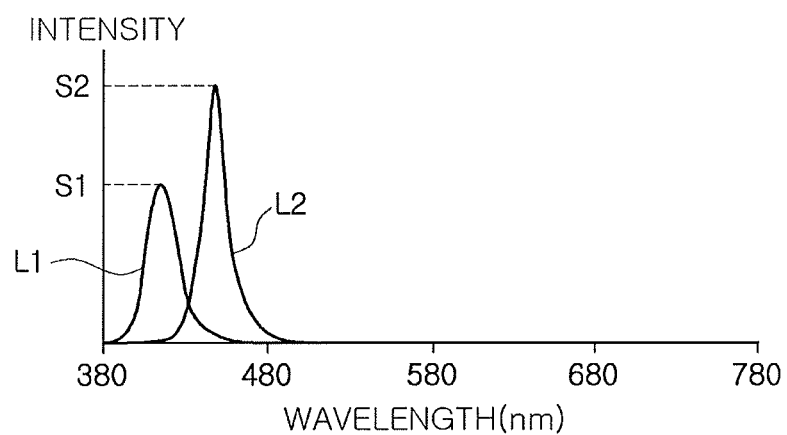
FIG. 2 illustrates an emission spectrum of light emitted by first and second LED chips of a light emitting device according to an exemplary embodiment.

As illustrated in FIG. 2, light output from the first and second LED chips 132 and 134, i.e., lights (L1 and L2), before transmission through the wavelength conversion film 150 may be adjusted to obtain a relative intensity condition of the short wavelength in the spectrum of the final white light (L3). The relative intensity condition of the short wavelength may be satisfied by lowering output (S) of light from the first LED chip 132 relative to output (S2) of light from the second LED chip 134.

The first LED chip 132 may be employed in a smaller number and/or a smaller size than the second LED chip 134. For example, the number of the first LED chips 132 may be less than the number of the second LED chips 134. In particular, the first and second LED chips 132 and 134 may be the same in size, the number of the first LED chips 132 may be one, and the number of the second LED chips 134 may be plural (See FIGS. 12 and 15). In another example, when a same number of first and second LED chips 132 and 134 is employed, the first LED chip 132 may be provided in a size smaller than a size of the second LED chip 134.

In this manner, by generating a difference in output between the two lights (L1 and L2), before conversion into the final white light (L3), the intensity of peak due to the light (L1) of the first LED chip 132 may be adjusted to be in the range of 15% or less, e.g., about 3% to 10%, of the intensity of peak due to the light (L2) of the second LED chip 134.

As described above, the first LED chip 132 may be implemented to improve the light conversion efficiency of the first and second quantum dots 154 and 156. That is, as absorption loss may increase due to surrounding optical elements (e.g., a light guide plate, various optical films, or the like), the wavelength may become shorter in practical applications, e.g., in a display device. Therefore, when the absorption loss is taken into account at an application level in which a relatively large number of surrounding optical elements are employed, the first LED chip 132 may be selected to have a wavelength of 410 nm or more.

For example, as illustrated in FIG. 4, the peak wavelength range (A1) of the first LED chip 134 may range from 410 nm to 430 nm, and the peak wavelength range (A2) of the second LED chip 136 may range from 440 nm to 460 nm. In some embodiments, the peak wavelength range (A2) of the second LED chip 136 may range from 445 nm to 460 nm.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Experimental Example 1

A peak wavelength of a second LED chip was set to 457 nm, while peak wavelengths of a first LED chip were adjusted sequentially to 414 nm, 421 nm, 430 nm, 440 nm, 448 nm, and 457 nm. Power conversion efficiency of a wavelength conversion film and transmittance of a diffusion sheet were measured. In this case, regarding the wavelength conversion film, first and second quantum dots (green and red quantum dots) were respectively provided as InP/ZnSe/ZnS, to prepare a wavelength conversion film containing a total of 8 wt % of first and second quantum dots.

The power conversion efficiency was expressed to be 100% as a relative value when the peak wavelength of the first LED chip was 414 nm, and the transmittance was expressed to be 100% when the peak wavelength of the first LED chip was 457 nm. Results of the measured relative conversion efficiency and transmittance in accordance with wavelength (based on varying wavelengths of the first LED chip) are illustrated in the graph of FIG. 5.

Figure 5:
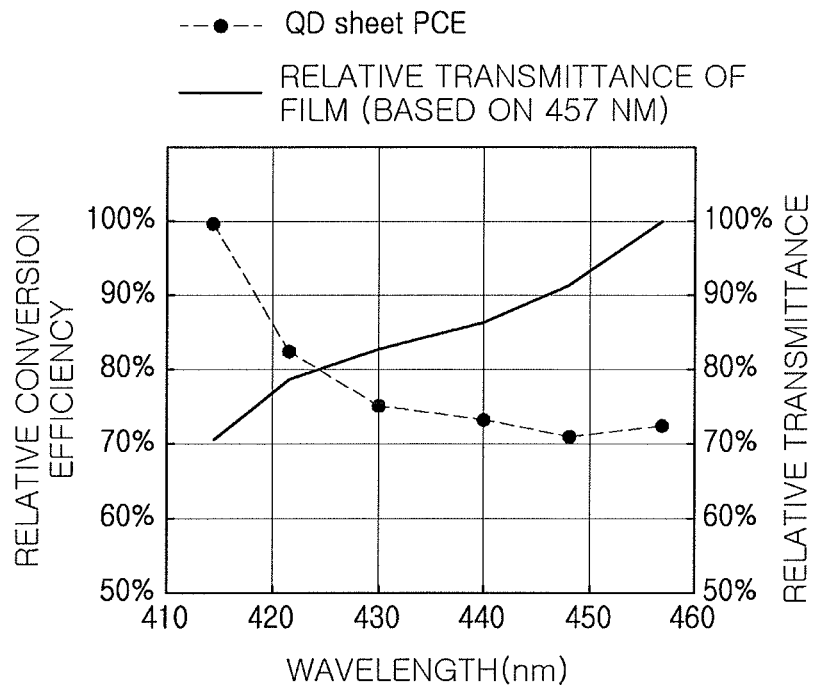
FIG. 5 illustrates a graph of conversion efficiency and transmittance of a quantum dot sheet.

As seen in FIG. 5, and as described above, as the peak wavelength of the first LED chip was shortened, the power conversion efficiency increased, but the transmittance of the diffusion sheet decreased. Considering both the increase in power conversion efficiency and the decrease in transmittance, the peak wavelength range of the first LED chip may range from 410 nm to 430 nm.

Experimental Example 2

A first LED chip was set to a peak wavelength of 414 nm, a second LED chip was set to a peak wavelength of 457 nm, and the same wavelength conversion film as in Experimental Example 1 was used to prepare a white light emitting device. DCI was measured as color reproduction ratio while changing an intensity ratio (s1'/s2') of peak wavelengths, based on final light emitted. The results are illustrated in a graph in FIG. 6.

Figure 6:
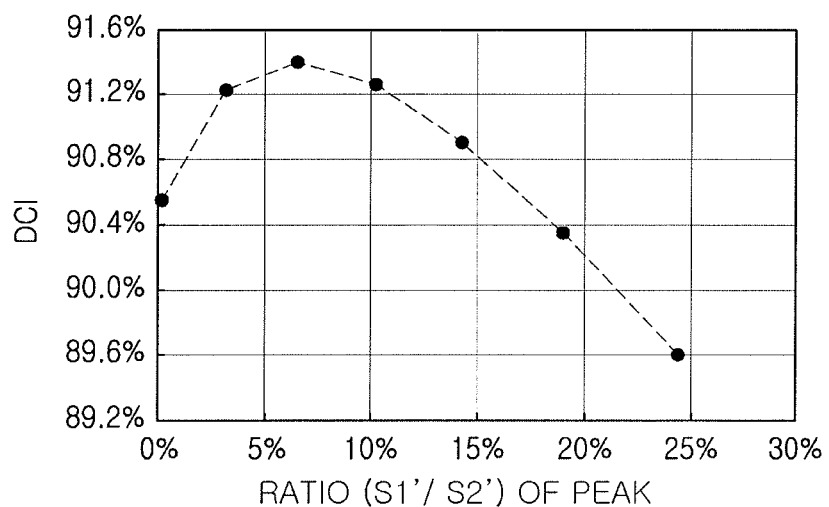
FIG. 6 illustrates a graph of color reproduction ratios, depending on peak intensity ratios S1'/S2'.

Referring to FIG. 6, a case in which an intensity ratio (s1'/s2') of peak wavelengths was 15% or less was illustrated to be higher than a case in which the first LED chip was absent (DCI=90.5%), especially to be higher in color reproduction ratio as high as about 91% in a range of 3% to 10%.

Figure 7:
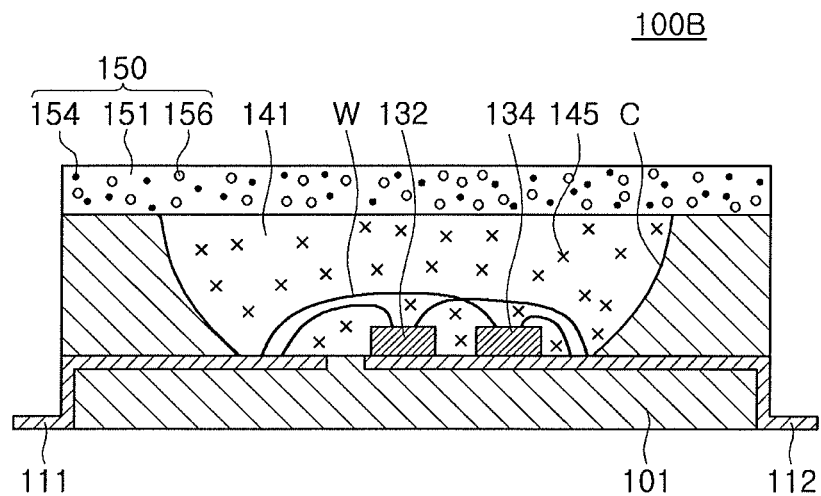
FIGS. 7 and 8 illustrate schematic cross-sectional views of light emitting devices according to various embodiments.
Figure 8:
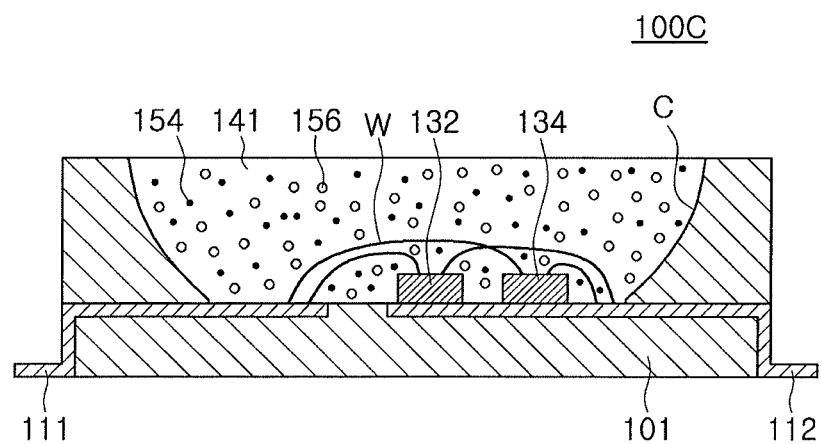

Various modifications may be carried out, depending on a position of the wavelength conversion film (or the first and second quantum dots), and introduction of additional phosphors. FIGS. 7 and 8 are schematic cross-sectional views of light emitting devices according to various embodiments.

Referring to FIG. 7, a light emitting device 100B according to this embodiment is similar to the light emitting device 100A illustrated in FIG. 1, except that the wavelength conversion film 150 is disposed, e.g., directly, on an upper surface of the resin packaging portion 141, and a phosphor 145 is introduced in the resin packaging portion 141. In addition, elements of this embodiment can be understood with reference to the description of the same or similar elements of the light emitting device 100A illustrated in FIG. 1, unless otherwise specified.

The phosphor 145 employed in this embodiment may further include at least one of a green phosphor and a red phosphor as an additional wavelength conversion material. For example, the green phosphor may include at least one of $(Ba,Sr)_2SiO_4$:Eu and β-SiAlON:Eu. The red phosphor may include at least one of $(Sr,Ca)AlSiN_3$:Eu, $K_2SiF_6$:Mn, and $CaAlSiN_3$:Eu.

Since the first and second quantum dots 154 and 156 are vulnerable to heat, the first and second quantum dots 154 and 156 may be arranged to be spaced apart from the first and second LED chips 132 and 134, respectively, to prevent deterioration in reliability due to heat. The additional phosphor 145 may be a ceramic material having a relatively high heat resistance, and may thus be included in the resin packaging portion 141.

The wavelength conversion film 150 may be located on a path by which light is emitted. In this embodiment, the wavelength conversion film 150 may be disposed to cover the resin packaging portion 141 on the package body 101.

Referring to FIG. 8, a light emitting device 100C according to this embodiment is similar to the light emitting device 100A illustrated in FIG. 1, except that the first and second quantum dots 154 and 156 are arranged within the resin packaging portion 141 without employing a wavelength conversion film. In addition, elements of this embodiment can be understood with reference to the description of the same or similar elements of the light emitting device 100A illustrated in FIG. 1, unless otherwise specified.

The first and second quantum dots 154 and 156 may be included in the resin packaging portion 141 to enhance heat resistance of the first and second quantum dots 154 and 156. For example, the resin packaging portion 141 may be made of epoxy, silicone, modified silicone, urethane, oxetane, acrylic, polycarbonate, polyimide, and combinations thereof. In some embodiments, an additional phosphor may be further included in the resin packaging portion 141, as in the embodiment illustrated in FIG. 7.

In the above-described embodiments, the lead frames 111 and 112 and the first and second LED chips 132 and 134 may be electrically connected to each other by the wire W. The first and second LED chips 132 and 134 may be directly connected to the lead frames 111 and 112, using conductive bumps in a case of a flip chip structure.

As described above, a LED chip applicable to a light emitting device according to an exemplary embodiment may have various structures. FIGS. 9 and 10 are cross-sectional views of LED chips in a light emitting device according to an exemplary embodiment.

Referring to FIG. 9, a LED chip 10A according to this embodiment may include a substrate 11, and a semiconductor stacked body S disposed on the substrate 11. The semiconductor stacked body S may include a first conductive type semiconductor layer 14, an active layer 15, and a second conductive type semiconductor layer 16, sequentially arranged on the substrate 11. A buffer layer 12 may be additionally disposed between the substrate 11 and the first conductive type semiconductor layer 14.

The substrate 11 may be an insulating substrate, e.g., sapphire, but is not limited thereto, and the substrate 11 may be a conductive or semiconductor substrate in addition to the insulating substrate. For example, the substrate 11 may be SiC, Si, $MgAl_2O_4$, MgO, $LiAlO_2$, $LiGaO_2$, or GaN, in addition to sapphire. A convex-concave portion P may be formed on an upper surface of the substrate 11. The convex-concave portion P may improve quality of a single crystal to be grown while improving extraction efficiency of light.

The buffer layer 12 may be $In_xAl_yGa_{1-x-y}N$ (0≤x<1, 0≤y<1). For example, the buffer layer 12 may be GaN, AlN, AlGaN, or InGaN. As necessary, a plurality of layers may be combined, or a composition may be gradually changed.

The first conductive type semiconductor layer 14 may be a nitride semiconductor layer satisfying an n-type $In_xAl_yGa_{1-x-y}N$ (0≤x<1, 0≤y<1, 0≤x+y<1), and the n-type impurity may be Si. For example, the first conductive type semiconductor layer 14 may include an n-type GaN. The second conductive type semiconductor layer 16 may be a nitride semiconductor layer satisfying a p-type $In_xAl_yGa_{1-x-y}N$ (0≤x<1, 0≤y<1, 0≤x+y<1), and the p-type impurity may be Mg. For example, the second conductive type semiconductor layer 16 may be realized as a single-layer structure, but may have a multilayer structure having compositions different from each other, as in this embodiment.

The active layer 15 may be a multiple quantum well (MQW) structure in which a quantum well layer and a quantum barrier layer are alternately stacked. For example, the quantum well layer and the quantum barrier layer may be $In_xAl_yGa_{1-x-y}N$ (0≤x≤1, 0≤y≤1, 0≤x+y≤1) having compositions different from each other. In a specific example, the quantum well layer may be $In_xGa_{1-x}N$ (0<x≤1), and the quantum barrier layer may be GaN or AlGaN. Thicknesses of the quantum well layer and the quantum barrier layer may be in a range of about 1 nm to about 50 nm, respectively. The active layer 15 is not limited to a multiple quantum well structure, but may be a single quantum well structure.

The first and second electrodes 19a and 19b may arranged on a mesa-etched region of the first conductive type semiconductor layer 14 and the second conductive type semiconductor layer 16, respectively, to be located on the same surface (a first surface). The first electrode 19a may include, e.g., Ag, Ni, Al, Cr, Rh, Pd, Ir, Ru, Mg, Zn, Pt, Au, or the like, and may be adopted as a structure having a single layer, or two or more layers. In some embodiments, the second electrode 19b may be a transparent electrode, e.g., a transparent conductive oxide or a transparent conductive nitride, or may include graphene. The second electrode 19b may include at least one of, e.g., Al, Au, Cr, Ni, Ti, and Sn.

Referring to FIG. 10, it can be understood that a LED chip 10B according to this embodiment is similar to the LED chip 10A illustrated in FIG. 9, except for an electrode structure and its related structure. In addition, elements of this embodiment can be understood with reference to the description of the same or similar elements of the LED chip 10A illustrated in FIG. 9, unless otherwise specified.

As illustrated in FIG. 10, the LED chip 10B may include first and second electrodes 22 and 24 connected to the first and second conductive type semiconductor layers 14 and 16, respectively. The first electrode 22 may include a connection electrode portion 22a connected to the first conductive type semiconductor layer 14 through the second conductive type semiconductor layer 16 and the active layer 15, and a first electrode pad 22b connected to the connection electrode portion 22a. The connection electrode portion 22a may have the same structure as a conductive via. The connection electrode portion 22a may be surrounded by an insulating portion 21 to be electrically separated from the active layer 15 and the second conductive type semiconductor layer 16. The connection electrode portion 22a may be disposed in a region from which the semiconductor stacked body S is etched. In the connection electrode portion 22a, the number, shape, pitch, or contact area of the connection electrode portion 22a with the first conductive type semiconductor layer 14 may be appropriately designed to lower contact resistance. Further, the connection electrode portion 22a may be arranged in rows and columns on the semiconductor stacked body S, to improve current flow. The second electrode 24 may include an ohmic contact layer 24a and a second electrode pad 24b on the second conductive type semiconductor layer 16.

The connection electrode portion 22a and the ohmic contact layer 24a may include a single-layer or multilayer structure of a conductive material having ohmic characteristics with the first and second conductive type semiconductor layers 14 and 16, respectively. The connection electrode portion 22a and the ohmic contact layer 24a may be formed by, e.g., a process of depositing or sputtering at least one of a metal, e.g., Ag, Al, Ni, Cr, and a transparent conductive oxide (TCO), e.g., ITO, and the like.

The first and second electrode pads 22b and 24b may be respectively connected to the connection electrode portion 22a and the ohmic contact layer 24a, to function as external terminals of the LED chip 10B. For example, the first and second electrode pads 22b and 24b may be Au, Ag, Al, Ti, W, Cu, Sn, Ni, Pt, Cr, NiSn, TiW, AuSn, or a eutectic metal thereof.

The first and second electrodes 22 and 24 may be arranged in the same direction, and may be mounted in a lead frame or the like in a so-called flip-chip form. The two electrodes 22 and 24 may be electrically separated from each other by the insulating portion 21. The insulating portion 21 may be any material having electrical insulating properties, e.g., a material having a relatively low light absorption ratio may be used. For example, silicon oxide or silicon nitride may be used. As necessary, a light reflecting material may be dispersed in a light transmitting material to form a light reflecting structure. Alternatively, the insulating portion 121 may be a multilayer reflecting structure in which a plurality of insulating films having different refractive indices are alternately stacked. For example, the multilayer reflecting structure may be a distributed Bragg reflector (DBR) in which a first insulating film having a first refractive index and a second insulating film having a second refractive index are alternately stacked.

The multilayer reflecting structure may be stacked by repeatedly stacking a plurality of insulating films having different refractive indices from 2 to 100 times. For example, the multilayer reflecting structure may be stacked by repeatedly stacking 3 to 70 times, e.g., repeatedly stacking 4 to 50 times. The plurality of insulating films of the multilayer reflective structure may be oxides or nitrides, e.g., $SiO_2$, SiN, $SiO_xN_y$, $TiO_2$, $Si_3N_4$, $Al_2O_3$, TiN, AlN, $ZrO_2$, TiAlN, TiSiN, and a combination thereof, respectively. The first insulating layer and the second insulating layer may be determined to have a refractive index ranging from about 1.4 to about 2.5. A refractive index of the first insulating layer and the second insulating layer may be less than a refractive index of the first conductive type semiconductor layer 14 and a refractive index of the substrate 11, or may be less than a refractive index of the conductive type semiconductor layer 14, but may be greater than a refractive index of the substrate 11.

The light emitting devices according to the above-described embodiments may be advantageously used as light sources of the backlight unit and the display device.

Figure 11:
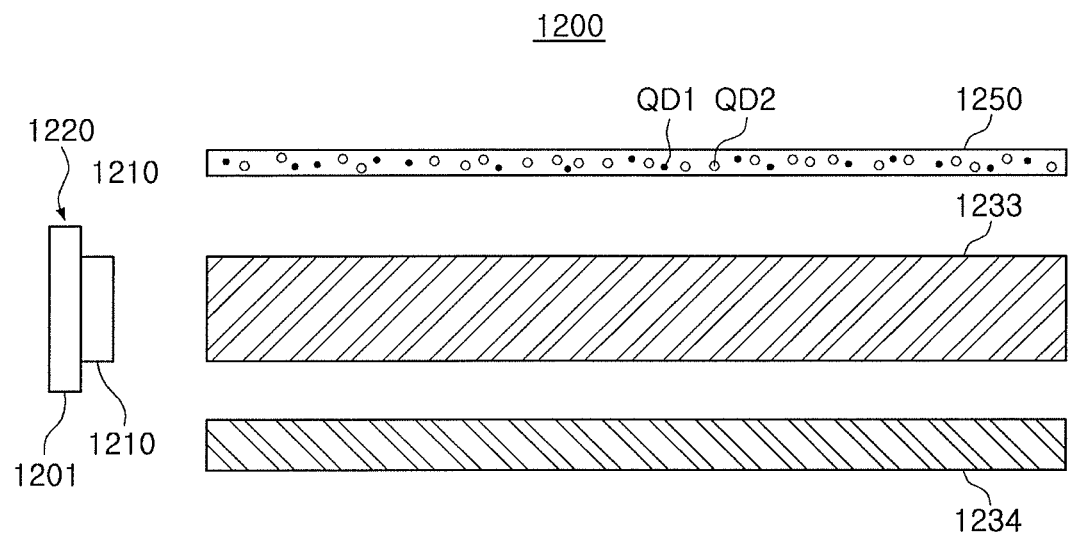
FIG. 11 illustrates a schematic cross-sectional view of a backlight unit (edge type) according to an exemplary embodiment.
Figure 12:
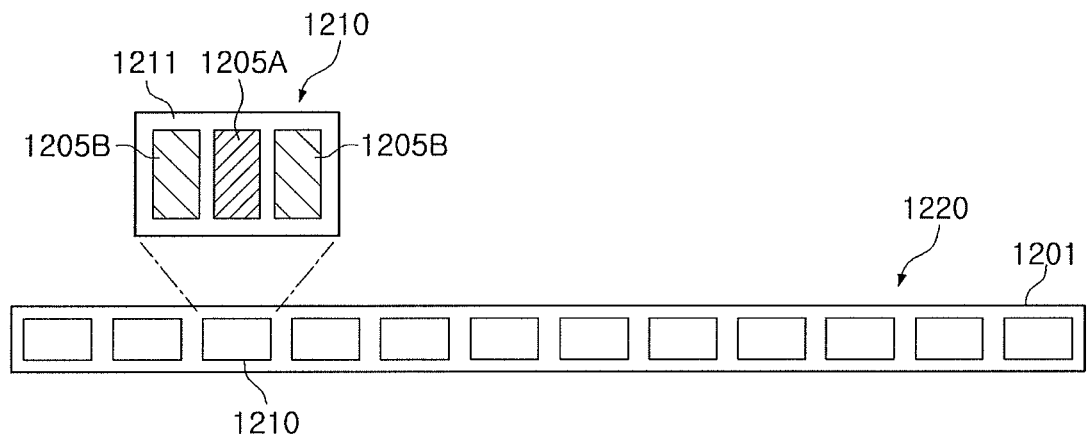
FIG. 12 illustrates a schematic plan view of an LED module in the backlight unit of FIG. 11.

FIG. 11 is a schematic cross-sectional view of a backlight unit (edge type) according to an exemplary embodiment. FIG. 12 is a schematic plan view of a LED module in the backlight unit of FIG. 11.

Referring to FIG. 11, a backlight unit 1200 according to this embodiment may include a light guide plate 1233, and an LED module 1220 radiating light to a side surface of the light guide plate 1233. The light of the LED module 1220 may be incident on the light guide plate 1233 to be converted into a surface light source. The backlight unit 1200 may further include a reflective layer 1234 disposed on a lower surface of the light guide plate 1233 such that light passing through the light guide plate 1233 may be emitted in an upward direction.

The LED module 1220 may include a circuit board 1201 and a plurality of light sources 1210 mounted thereon. As illustrated in FIG. 12, the LED module 1220 may include a bar-shaped circuit board 1201 and a plurality of light sources 1210 arranged in a longitudinal direction. It can be understood that the plurality of light sources 1210 may be the same as the light emitting device 100A of FIG. 1, except for the wavelength conversion film 150. That is, each single light source of the plurality of light sources 1210 may be substantially the same as one light emitting device 100A, e.g., to include the first and second LED chips 132 and 134, with the exception of the structure of a wavelength conversion film. As illustrated in FIG. 11, a wavelength conversion film 1250 may be spaced apart from the plurality of light sources 1210, and may be disposed on an upper surface of the light guide plate 1233, e.g., the wavelength conversion film 1250 may be parallel to the light guide plate 1233 to completely overlap the light guide plate 1233.

The wavelength conversion film 1250 may include a transparent body containing first and second quantum dots QD1 and QD2. As described above, the first quantum dot QD1 may convert at least a portion of light, among the emitted light, into green light, e.g., light having a peak wavelength in a range of 510 nm to 550 nm, and the second quantum dot QD2 may convert at least a portion of light, among the emitted light, into red light, e.g., light having a peak wavelength in a range of 610 nm to 660 nm.

For example, each of the plurality of light sources 1210 may include one first LED chip 1205A and two second LED chips 1205B, arranged in a package body 1211, as illustrated in FIG. 12. In an emission spectrum of final light, an intensity of a peak wavelength of the first LED chip 1205A may be maintained at 15% or less of intensity of the second LED chip 1205B, by disposing the number of the first LED chips 1205A less than the number of the second LED chips 1205B.

Figure 13:
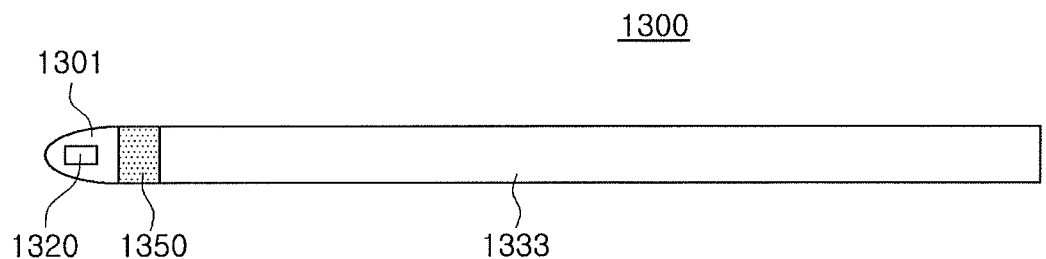
FIG. 13 illustrates a schematic cross-sectional view of a backlight unit (edge type) according to an exemplary embodiment.

Referring to FIG. 13, a backlight unit 1300 according to this embodiment may be an edge type backlight unit, and may include a light guide plate 1333, and an LED module 1320 disposed on a side surface of the light guide plate 1333. A wavelength conversion member 1350 corresponding to a wavelength conversion film may be disposed between the side surface of the light guide plate 1333 and the LED module 1320. In some embodiments, light emitted by the LED module 1320 may be guided into the interior of the light guide plate 1330 by a reflective structure 1301.

The wavelength conversion member 1350 employed in this embodiment may include a transparent body containing first and second quantum dots, in the same or similar manner to the wavelength conversion film. As described above, the first quantum dot may convert at least portion of light, among the emitted light, into green light, e.g., light having a peak wavelength in a range of 510 nm to 550 nm, and the second quantum dot may convert at least portion of light, among the emitted light, into red light, e.g., light having a peak wavelength in a range of 610 nm to 660 nm.

Figure 14:
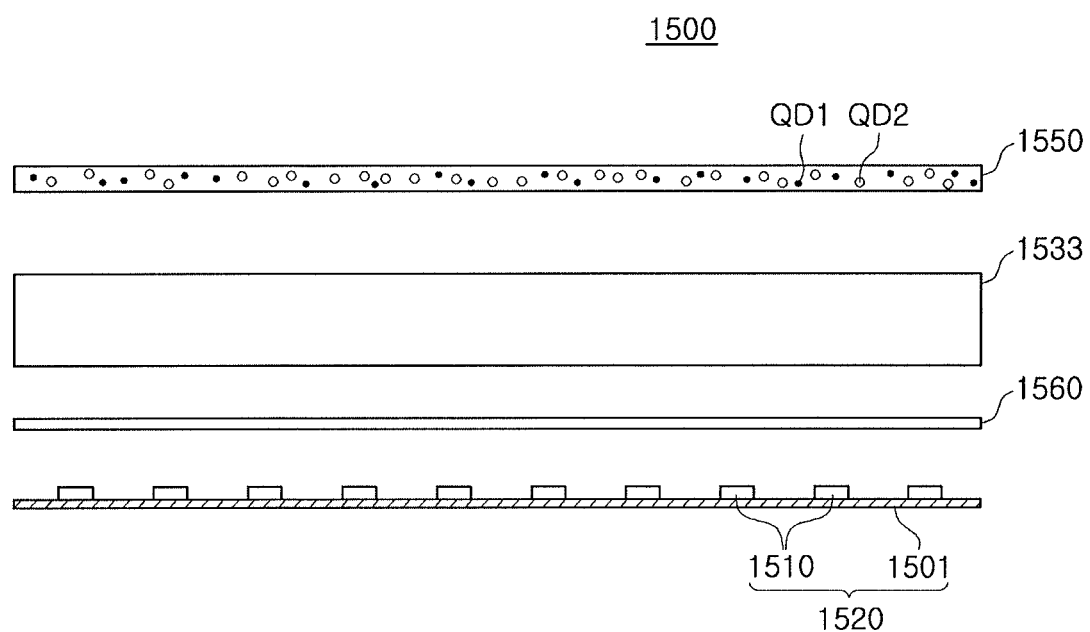
FIG. 14 illustrates a schematic cross-sectional view of a backlight unit (direct type) according to an exemplary embodiment.
Figure 15:
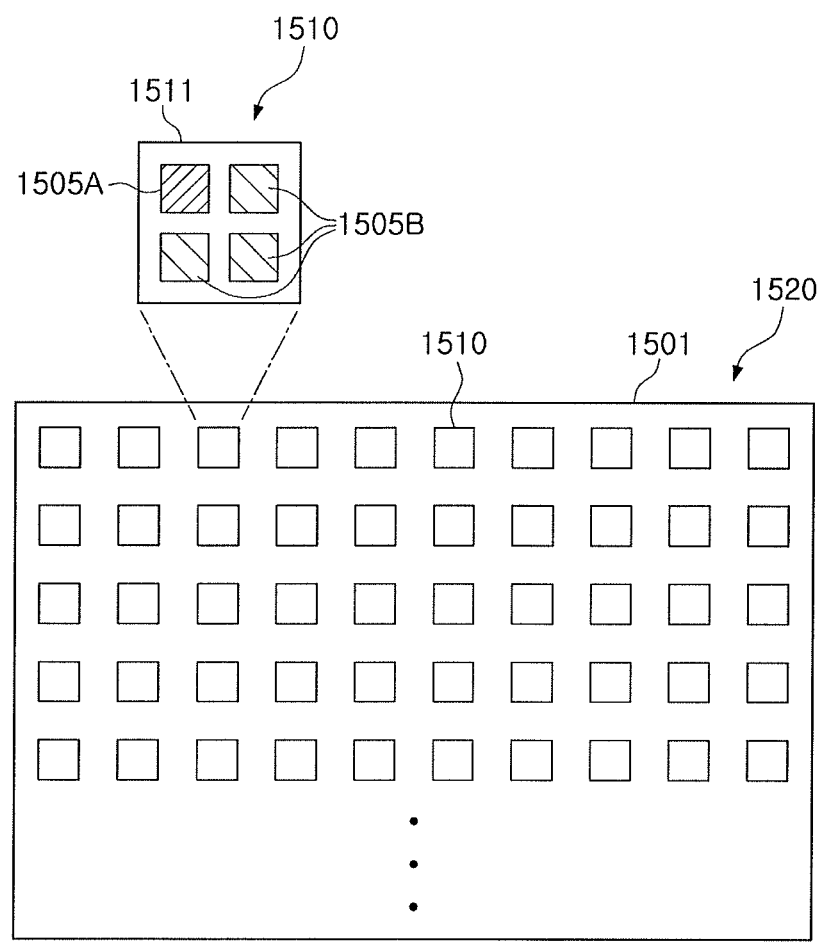
FIG. 15 illustrates a schematic plan view of an LED module in the backlight unit of FIG. 14.

FIG. 14 is a schematic cross-sectional view of a backlight unit (direct type) according to an exemplary embodiment, and FIG. 15 is a schematic plan view of an LED module in the backlight unit of FIG. 14.

Referring to FIG. 14, a backlight unit 1500 according to this embodiment may be an example of a direct type backlight unit. The backlight unit 1500 may include a light guide plate 1533, a wavelength conversion film 1550 disposed on an upper surface of the light guide plate 1533, and an LED module 1520 disposed on a lower surface of the wavelength conversion film 1550. In addition, the backlight unit 1500 may introduce a diffusion film 1560 between the light guide plate 1533 and the LED module 1520. Various optical films (e.g., polarizing films) and the like may be employed in addition to the diffusion film.

The LED module 1520 may include a circuit board 1501, and a plurality of light sources 1510 mounted on the circuit board 1501. The circuit board 1501 may have an area substantially corresponding to the light guide plate 1533, e.g., the backlight unit. As illustrated in FIG. 15, the LED module 1520 may include the circuit board 1501, and the plurality of light sources 1510 arranged in a plurality of rows and a plurality of columns. It can be understood that the plurality of light sources 1510 may be the same as the light emitting device 100A of FIG. 1, except for the wavelength conversion film 150. As illustrated in FIG. 14, the wavelength conversion film 1550 may be spaced apart from the plurality of light sources 1510 to be disposed on an upper surface of the light guide plate 1533.

The wavelength conversion film 1550 may include a transparent body containing first and second quantum dots QD1 and QD2. As described above, the first quantum dot QD1 may convert at least portion of light, among the emitted light, into green light, e.g., light having a peak wavelength in a range of 510 nm to 550 nm, and the second quantum dot QD2 may convert at least portion of light, among the emitted light, into red light, e.g., light having a peak wavelength in a range of 610 nm to 660 nm.

Each of the plurality of light sources 1510 may include one first LED chip 1505A and three second LED chips 1505B arranged in a rectangular shape on a package body 1511, as illustrated in FIG. 15. In emission spectrum of final light, intensity of a peak wavelength of the first LED chip 1505A may be maintained at 15% or less of intensity of the second LED chip 1505B, by disposing the number of the first LED chips 1505A less than the number of the second LED chips 1505B.

Figure 16:
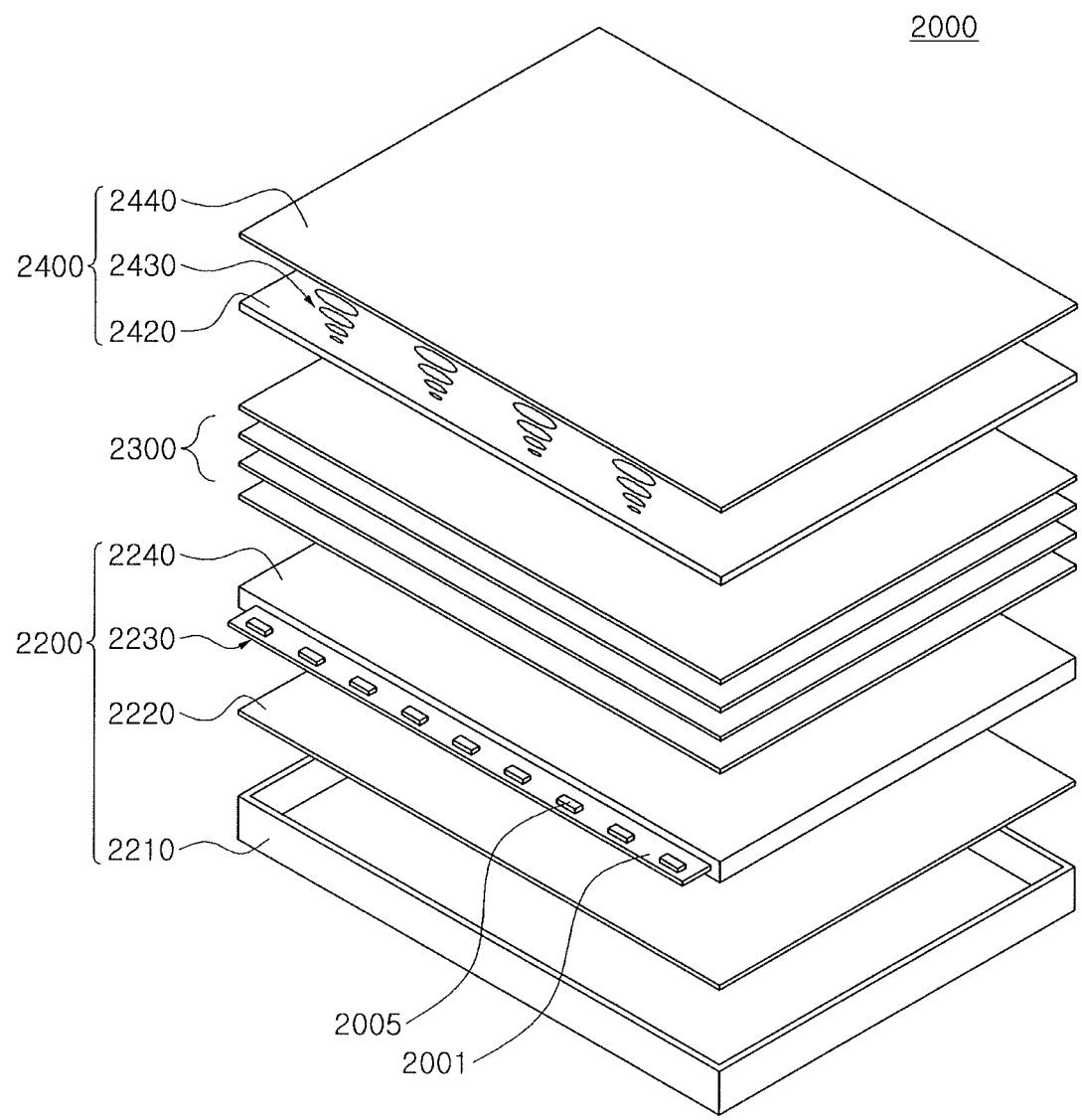
FIG. 16 illustrates a schematic exploded perspective view of a display device according to an exemplary embodiment.

FIG. 16 is a schematic exploded perspective view of a display device according to an exemplary embodiment.

Referring to FIG. 16, a display device 2000 according to this embodiment may include a backlight unit 2200, an optical sheet 2300, and an image display panel 2400, e.g., a liquid crystal panel.

The backlight unit 2200 may include a bottom case 2210, a reflection plate 2220, a light guide plate 2240, and an LED module 2230 provided on at least one side surface of the light guide plate 2240. The LED module 2230 may include a circuit board 2001, and a plurality of light sources 2005 arranged on the circuit board 2001. Each of the plurality of light sources may be a light emitting device according to the above-described embodiments. The plurality of light sources 2005 employed in this embodiment may be a side-view type light emitting device in which a light emitting window is mounted on a side surface.

In some embodiments, the backlight unit 2200 may be replaced with any one of the backlight units 1200, 1300, and 1500 illustrated in FIGS. 11, 13, and 14. For example, a wavelength conversion film may be used to locate, e.g., position, first and second quantum dots on a light emission path (e.g., a surface of the light guide plate), to be separated from the LED module causing heat generation.

The optical sheet 2300 may be disposed between the light guide plate 2240 and the image display panel 2400. The optical sheet 2300 may include various kinds of sheets, e.g., a diffusion sheet, a prism sheet, or and/a protective sheet.

The image display panel 2400 may display an image using light emitted by the optical sheet 2300. For example, the image display panel 2400 may include an array substrate 2420, a liquid crystal layer 2430, and a color filter layer 2440. The array substrate 2420 may include pixel electrodes arranged in a matrix form, thin film transistors applying a driving voltage to the pixel electrodes, and signal lines operating the thin film transistors.

The color filter layer 2440 may include a transparent substrate, a color filter, and a common electrode. The color filter layer 2440 may include filters selectively passing light of a specific wavelength among white light emitted by the backlight unit 2200. The liquid crystal layer 2430 may be rearranged by an electric field formed between the pixel electrode and the common electrode to control light transmittance. Light having the controlled light transmittance may display an image by passing through the color filter of the color filter layer 2440. The image display panel 2400 may further include a drive circuit unit processing an image signal, or the like.

By way of summation and review, quantum dots may be used as wavelength conversion materials for producing white light in a display device. However, when red and green quantum dots are mixed with blue light emitted from a blue LED chip, light conversion efficiency of the blue light may be relatively low, and loss of the blue light may be relatively high, causing a relatively large loss of power. Further, the quantum dots may deteriorate due to heat generated from the LED chip.

Therefore, exemplary embodiments provide a light emitting device in which light loss may be reduced and power efficiency may be improved by improving light conversion efficiency of a quantum dot used as a wavelength conversion material. Exemplary embodiments also provide a backlight unit and a display device including a light emitting device with reduced light loss and improved power efficiency.

That is, according to an exemplary embodiment, a light emitting device includes a first LED chip emitting near-UV or violet light (rather than blue light at a higher wavelength) as excitation light of the quantum dots, in addition to a second LED chip emitting blue light, in order to improve the light conversion efficiency of the quantum dots. Accordingly, a concentration of the quantum dots may be lowered in the wavelength conversion film, while the light extraction efficiency may be improved.

In addition, according to an exemplary embodiment, in the spectrum of the final white light, the peak of the first LED chip may be designed to be 15% or less of the peak intensity of the blue light, to improve the power efficiency and minimize harm to the human body caused by short wavelength light.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A light emitting device, comprising:
   at least one first light emitting diode (LED) chip to emit a first blue light having a peak wavelength in a range of 414 nm to 430 nm;
   at least one second LED chip to emit a second blue light having a peak wavelength in a range of 440 nm to 460 nm;
   a first quantum dot on a path of light emitted by the at least one first LED chip and the at least one second LED chip, the first quantum dot to convert a first portion of the first and second blue light emitted by the at least one first LED chip and the at least one second LED chip into light having a peak wavelength in a range of 510 nm to 550 nm; and
   a second quantum dot on a path of light emitted by the at least one first LED chip and the at least one second LED chip, the second quantum dot to convert a second portion of the first and second blue light emitted by the at least one first LED chip and the at least one second LED chip into light having a peak wavelength in a range of 610 nm to 660 nm,
   wherein, in an emission spectrum of final light emitted from the first and second quantum dots, an intensity of a peak wavelength of the at least one first LED chip is equal to 15% or less of an intensity of a peak wavelength of the at least one second LED chip.

2. The light emitting device as claimed in claim 1, wherein a number of the at least one first LED chip is smaller than a number of the at least one second LED chip.

3. The light emitting device as claimed in claim 2, wherein a size of the at least one first LED chip is identical to a size of the at least one second LED chip, and the number of the at least one first LED chip is one (1), and the number of the at least one second LED chip is plural.

4. The light emitting device as claimed in claim 1, wherein a size of the at least one first LED chip is smaller than a size of the at least one second LED chip.

5. The light emitting device as claimed in claim 1, wherein the peak wavelength of the at least one second LED chip is in a range of 445 nm to 460 nm.

6. The light emitting device as claimed in claim 1, wherein the intensity of the peak wavelength of the at least one first LED chip is in a range of 3% to 10% of the intensity of the peak wavelength of the at least one second LED chip.

7. The light emitting device as claimed in claim 1, wherein each of the first and second quantum dots includes at least one of InP/ZnS, InP/ZnSe, CdSe/CdS, CdSe/ZnS, PbS/ZnS, InP/ZnSe/ZnS, and InP/GaP/ZnS.

8. The light emitting device as claimed in claim 1, further comprising a wavelength conversion film on the path of light emitted by the at least one first LED chip and the at least one second LED chip, the wavelength conversion film including a transparent resin body with the first and second quantum dots, and the final light being emitted directly from the wavelength conversion film.

9. The light emitting device as claimed in claim 8, wherein each of the first and second quantum dots includes at least one of InP/ZnS, InP/ZnSe, and InP/ZnSe/ZnS, the first quantum dot being 5 wt % to 10 wt % of the transparent resin body, and the second quantum dot being 1 wt % to 5 wt % of the transparent resin body.

10. A light emitting device, comprising:
    a first light emitting diode (LED) chip to emit a first blue light having a peak wavelength in a range of 414 nm to 430 nm;
    a second LED chip to emit a second blue light having a peak wavelength in a range of 440 nm to 460 nm; and
    a wavelength conversion film on a path of light emitted by the first and second LED chips, the wavelength conversion film including first and second quantum dots to convert a portion of the light emitted by the first and second LED chips into light of first and second peak wavelengths, respectively,
    wherein the first peak wavelength is in a range of 510 nm to 550 nm, the second peak wavelength is in a range of 610 nm to 660 nm, and, in an emission spectrum of final light emitted from the wavelength conversion film, intensity of a peak wavelength of the first LED chip is equal to 15% or less of intensity of a peak wavelength of the second LED chip.

11. The light emitting device as claimed in claim 10, wherein a number of the first LED chips is smaller than a number of the second LED chips.

12. The light emitting device as claimed in claim 10, further comprising a resin packaging portion surrounding the first and second LED chips, the wavelength conversion film being spaced apart from the resin packaging portion.

13. The light emitting device as claimed in claim 12, wherein the resin packaging portion includes at least one phosphor of a green phosphor and a red phosphor.

14. The light emitting device as claimed in claim 13, wherein the green phosphor includes at least one of $(Ba,Sr)_2SiO_4$:Eu and $\beta$-SiAlON:Eu.

15. The light emitting device as claimed in claim 13, wherein the red phosphor includes at least one of $(Sr,Ca)AlSiN_3$:Eu, $K_2SiF_6$:Mn, and $CaAlSiN_3$:Eu.

16. A backlight unit, comprising:
    a light emitting diode (LED) module including:
        a first LED chip to emit a first blue light having a peak wavelength in a range of 414 nm to 430 nm, and
        a second LED chip to emit a second blue light having a peak wavelength in a range of 440 nm to 460 nm; and
    a wavelength conversion film on a path of light emitted by the first and second LED chips, the wavelength conversion film including first and second quantum dots to convert a portion of the light emitted from the LED module into light of first and second peak wavelengths, respectively,
    wherein the first peak wavelength is in a range of 510 nm to 550 nm, the second peak wavelength is in a range of 610 nm to 660 nm, and, in an emission spectrum of final light emitted from the wavelength conversion film, intensity of a peak wavelength of the first LED chip is equal to 15% or less of intensity of a peak wavelength of the second LED chip.

17. The backlight unit as claimed in claim 16, wherein:
    the LED module includes a plurality of light sources having the first LED chip and the second LED chip, and
    in each of the light sources, a number of the first LED chips is smaller than a number of the second LED chips.

18. The backlight unit as claimed in claim 16, further comprising a light guide plate having an edge supporting the LED module, the wavelength conversion film being on an upper surface of the light guide plate.

19. The backlight unit as claimed in claim 16, further comprising a light guide plate having a lower surface supporting the LED module, the wavelength conversion film being on an upper surface of the light guide plate.

20. The backlight unit as claimed in claim 16, wherein the peak wavelength of the second LED chip is in a range of 445 nm to 460 nm.

* * * * *